United States Patent [19]

Hart

[11] Patent Number: 4,772,853
[45] Date of Patent: Sep. 20, 1988

[54] DIGITAL DELAY FM DEMODULATOR WITH FILTERED NOISE DITHER

[75] Inventor: Billy D. Hart, Cedar Rapids, Iowa

[73] Assignee: Rockwell International Corporation, El Segundo, Calif.

[21] Appl. No.: 84,661

[22] Filed: Aug. 12, 1987

[51] Int. Cl.[4] .......................... H03D 3/06; H03K 9/06
[52] U.S. Cl. ..................... 329/107; 329/126; 329/137; 329/145; 331/78
[58] Field of Search .............. 329/104, 105, 107, 110, 329/126, 127, 128, 137, 145; 375/78, 80, 82, 94, 99

[56] References Cited

U.S. PATENT DOCUMENTS

| | | | |
|---|---|---|---|
| 3,479,457 | 11/1969 | Oswald | 375/78 |
| 3,778,727 | 12/1973 | Williams | 329/145 X |
| 4,368,434 | 1/1983 | Miller et al. | 329/126 X |
| 4,408,352 | 10/1983 | Dudding | 455/295 |
| 4,553,102 | 11/1985 | Yoshida | 329/133 |
| 4,577,333 | 3/1986 | Lewis et al. | 375/45 |
| 4,635,298 | 1/1987 | Kage et al. | 455/295 |

OTHER PUBLICATIONS

"Digital Circuit Detects Frequency-Modulated Signals", *Electronic Design*, Apr. 12, 1976, p. 126.

*Primary Examiner*—Siegfried H. Grimm
*Attorney, Agent, or Firm*—M. Lee Murrah; V. Lawrence Sewell; H. Fredrick Hamann

[57] ABSTRACT

Audio beat notes produced by sampling a square wave in a digital quadrature FM demodulator are reduced by adding filtered random noise, or dither, to the signal to be demodulated to randomly vary the width of successive pulses in the square wave. Filtration of the random noise prevents feedthrough of noise which would degrade the demodulated signal.

9 Claims, 5 Drawing Sheets

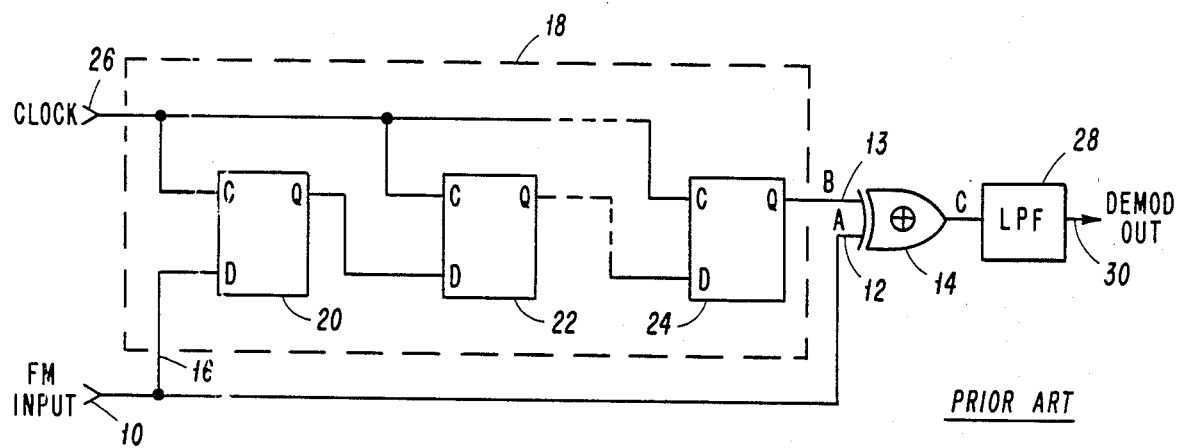
PRIOR ART
FIG 1
PRIOR ART
FIG 2a
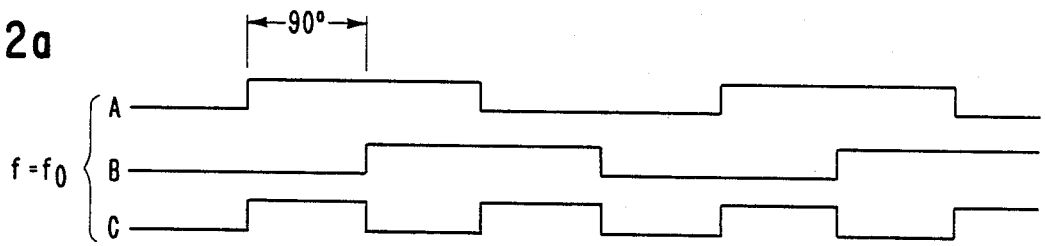
FIG 2b
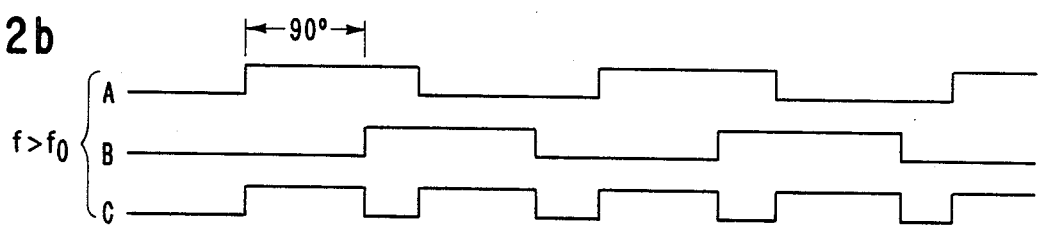
FIG 2c
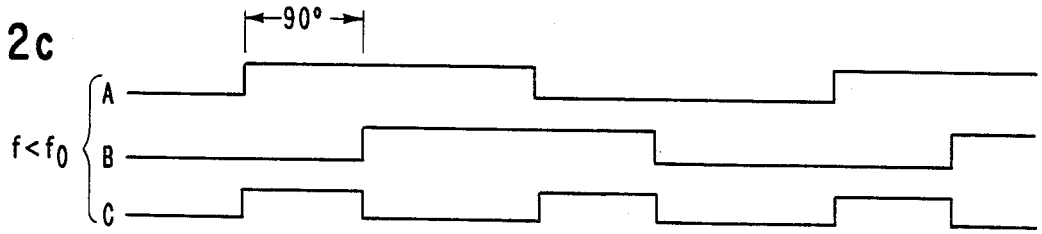

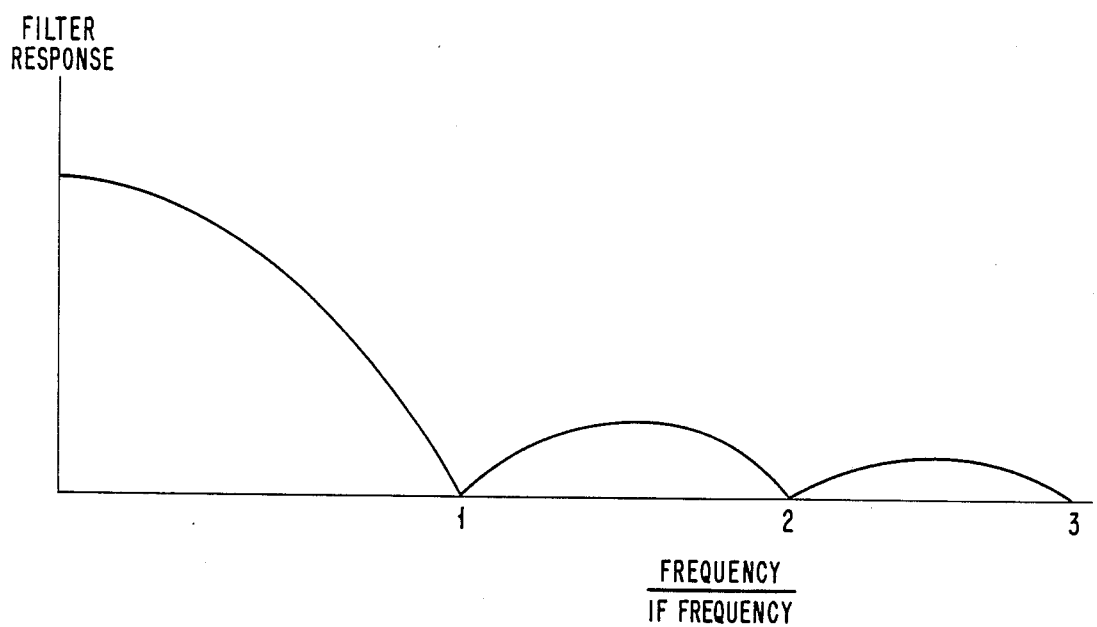
FIG 7a
FIG 7b
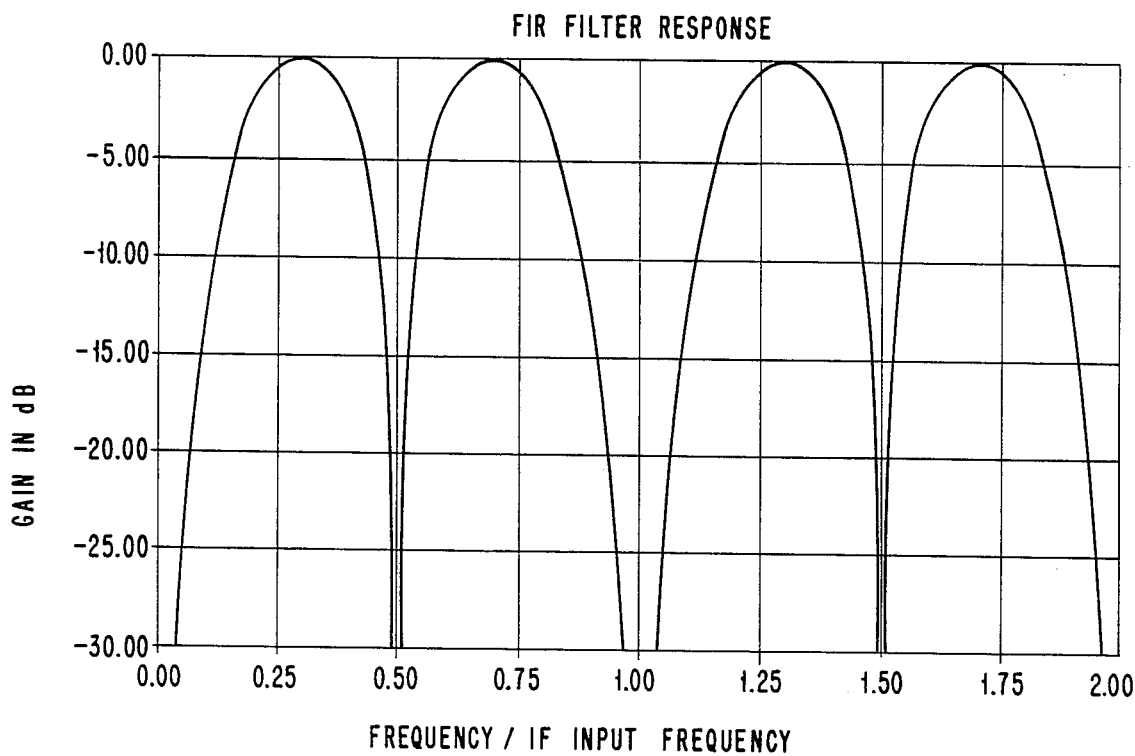

DIGITAL DELAY FM DEMODULATOR WITH FILTERED NOISE DITHER

This invention was made with government support under Contract No. N00019-84-C-0128-MOD-P00003 awarded by NAVAIR. The government has certain rights in this invention.

BACKGROUND OF THE INVENTION

The invention relates to FM demodulators, and more particularly to digital FM demodulators, and most particularly to such demodulators employing the quadrature technique.

The principle of the quadrature demodulator is well-known in the art. In summary, the technique involves mixing an FM radio frequency signal with a version of the same signal which has been delayed 90° at the center frequency ($f_o$) of the FM signal. The resulting signal contains a DC component whose time varying level is representative of the original modulating signal. The digital version of the quadrature FM demodulator was disclosed by David Ludington in *Electronic Design*, Apr. 12, 1976, p. 126, which article is incorporated herein by reference.

The digital versions of the quadrature FM demodulator are subject to audio noise due to the use of clocked shift registers to provide the required 90° phase shift. The noise results from an interaction between the shift register clock rate and the period of the FM signal being demodulated to produce beat frequencies, as will be more fully described hereinafter. This noise is, of course, detrimental to the operation of the demodulator, and it is desirable that it be removed.

It is therefore an object of the present invention to provide a digital FM demodulator which reduces the amplitudes of beat frequencies caused by digital sampling.

It is another object of the present invention to provide a digital demodulator with reduced noise feedthrough.

SUMMARY OF THE INVENTION

Beat notes produced by square wave sampling in a digital FM demodulator are alleviated by adding random noise, or dither, to the square wave signal to randomly vary the width of successive pulses in the square wave signal. This eliminates repetitive sampled bit patterns resulting from lack of an integral multiple relationship between the frequency of the square wave and the sampling frequency, which produce an audio beat note in the demodulator output. By shaping the spectrum of the added noise, noise feedthrough is reduced.

BRIEF DESCRIPTION OF THE DRAWINGS

The invention may be more fully understood by reading the following description of a preferred embodiment thereof in conjunction with the appended drawings, wherein:

FIG. 1 is a block diagram of a digital quadrature FM demodulator as practiced in the prior art;

FIGS. 2a, 2b, and 2c are a series of waveforms produced in the demodulator of FIG. 1;

FIGS. 7a and 7b are frequency plots of possible FIR filter designs for use with the circuit of FIG. 6.

DESCRIPTION OF A PREFERRED EMBODIMENT

Figure 3:
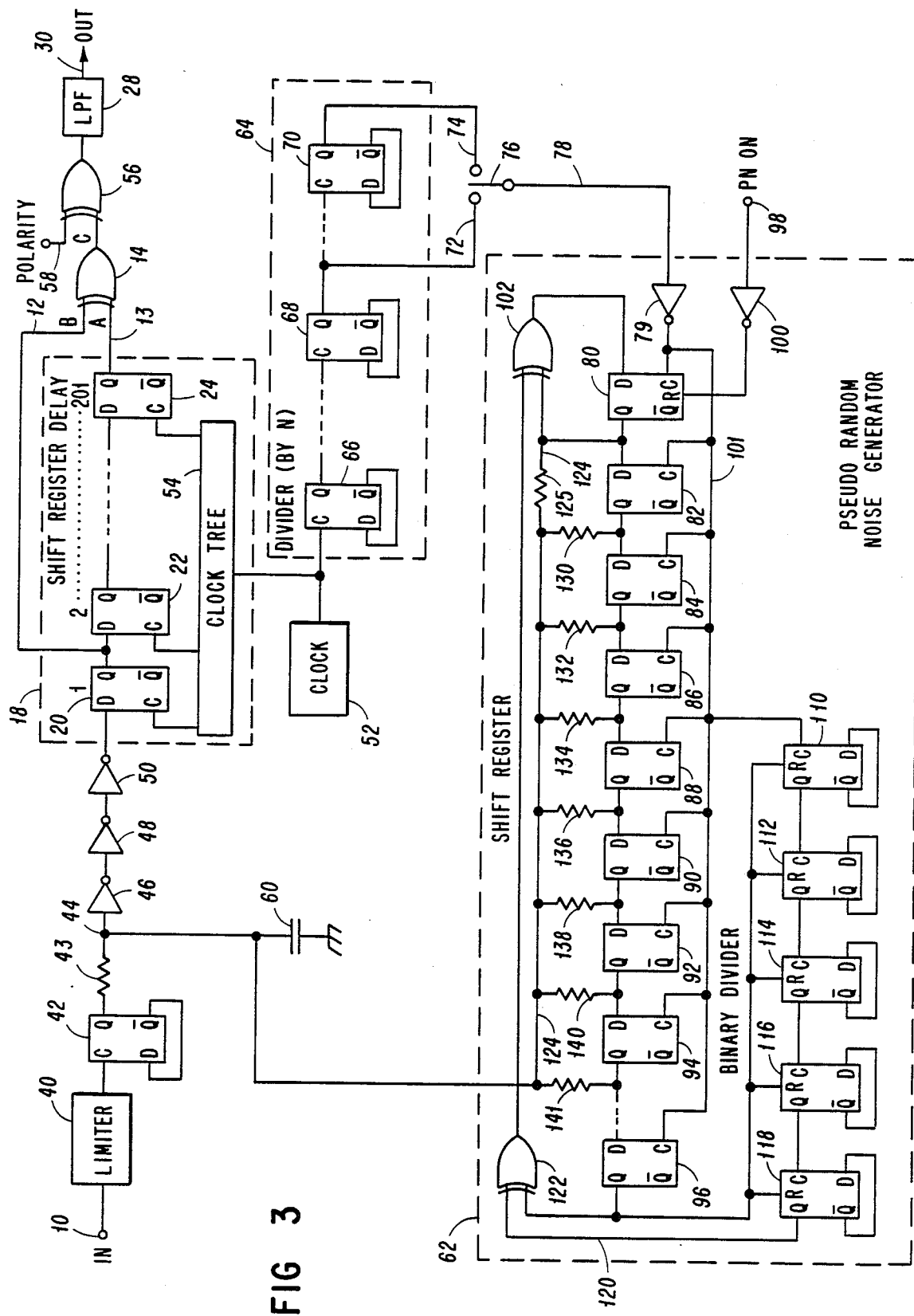
FIG. 3 is a schematic diagram of a digital quadrature FM demodulator with dither added in accordance with the present invention.

A simplified version of a digital quadrature FM demodulator of the type used in the present invention is shown in FIG. 1. An FM signal in the form of an input limited FM wave is applied at terminal 10 and is coupled to one input 12 of an exclusive-OR gate 14. The FM signal is also applied via line 16 to a delay device 18 which may be implemented as a digital shift register comprising a serial combination of D-type flip-flops 20, 22 and 24. While only three flip-flops are shown, the dotted interconnections between flip-flops 22 and 24 are intended to indicate that a larger number required to provide a 90° phase delay is provided in delay device 18. A clock signal is applied to terminal 26 and is in turn coupled to the "C" input of each of flip-flops 20, 22, 24, etc. Further, the "Q" output of each flip-flop, say 20 for example, is coupled to the "D" input of the succeeding flip-flop, say 22 for example. The "Q" output of the final, or Nth, flip-flop 24 is coupled to input 13 of exclusive-OR gate 14. The output of exclusive-OR gate 14 is applied to a low-pass filter (LPF) 28 whose output 30 is the demodulated signal.

When shift register 18 is clocked by a stable frequency source at terminal 26, the incoming FM signal is sampled at the clock rate, and the contents of the register become a binary time representation of the FM signal. The bit pattern in register 18 is, of course, a function of the frequency ratio between the FM input signal at terminal 10 and the clock signal at terminal 26. When the length of register 18 in flip-flop stages is such that one quarter cycle of the center frequency of the FM input signal is stored at any instant, the digital register is equivalent to an analog 90° delay line. When the input and output of the line are applied to a phase detector, the detector output varies with frequency as the delay line shift varies around 90°. Exclusive-OR gate 14 is the digital equivalent of an analog doubly balanced mixer. Its output is a 50% duty cycle wave when the square wave inputs are 90° apart. Low-pass filter 28 passes the average value of the comparator output which is linearly proportional to the difference between the clock frequency and a harmonic of the FM input frequency.

For a 90° time delay, the shift register length, N, is related to the clock frequency, fc, and modulated frequency, fm, by the relation:

N = fc/4fm

The ratio of the average output voltage change to input frequency change may be increased by using additional multiples of N stages in the shift register at the expense of increased complexity and operating power demand. The output stability of the demodulator is determined by the clock accuracy, which may be made very high, and by the logic "0" and "1" voltage stability of the exclusive-OR gate. The latter is excellent for CMOS logic whose output transistors saturate to either ground or to the drain supply voltage.

The waveforms produced by the operation of the circuit of FIG. 1 are shown in FIGS. 2a, 2b, and 2c. The waveforms are shown in three groups (a), (b) and (c), each comprising three waveforms. Group (a) illustrates the waveforms, at the points marked A, B and C in FIG. 1 when the FM input signal is equal to the center, or carrier, frequency $f_o$ of the input signal. Group (b) illustrates the waveforms at the same points, when the input frequency f is greater than $f_o$. Lastly, group (c) illustrates the waveforms at points A, B and C when the input frequency f is less than $f_o$. The signal at point A is the unaltered FM input signal originally applied at terminal 10, and the signal at point B is the FM input signal delayed by a time corresponding to 90° at frequency $f_o$ by passage through shift register delay device 18, as shown in each of groups (a), (b) and (c). The signal at B is delayed by 90° based upon the center frequency $f_o$. The signal appearing at point C is the resultant waveform after the A and B waveforms have been exclusive-OR'ed by gate 14.

When $f=f_o$ as in group (a), the duty cycle of essentially 50%, i.e., the waveform has a high, or a logical "1" value equally as long as it has a low, logical "0" value. When f is greater than $f_o$, the duty cycle increases as shown in group (b); and ; and when f is less than $f_o$, the duty cycle decreases. Thus, the average value of waveform C in group (b) is larger than waveform C in group (a). Conversely, the average value of waveform C in group (c) is smaller than that of waveform C in group (a). Thus, the average value of the waveform at C derived by LPF 28 (FIG. 1) is representative of the instantaneous frequency of the FM input signal, and consequently is representative of the original modulating signal.

Since the clock signal applied at terminal 26 causes shift register 18 to sample the input FM signal at discrete intervals, the bit pattern in shift register 18 will vary slightly from each 90° sample to the next even when the frequency of the input signal is constant unless the clock frequency is an integer multiple of the input signal frequency. If there were an integer relationship between the clock and the input signal, one would expect for every 100 clock transitions to see 100 "1'"s followed by 100 "0'"s, assuming a 50% duty cycle, i.e., $f=f_o$. But, if the clock is not an integer multiple of the input signal, one might see 100 "1'"s followed by 100 "0'"s, and then in the next round see 101 "1'"s and 100 "0'"s. As the phase relationship slides back and forth, a pattern such as 100, 100, 101, 100, 100, 101 ... might be observed. This is a digital beat frequency pattern which may manifest itself in the demodulated signal as a slightly varying output voltage in the audio range.

It has been found that the audible beat note can be eliminated by randomizing the transitions of the FM input signal to destroy the beat pattern in shift register 10. This is accomplished by adding random noise, or dither, to the FM input signal in the manner illustrated in FIG. 3.

Figure 4A:
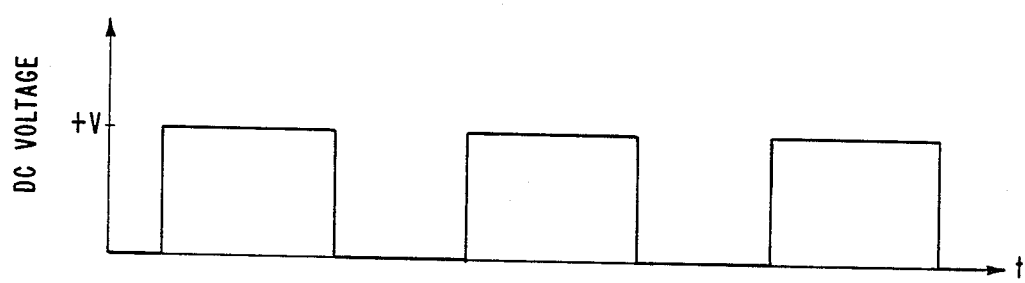
FIGS. 4a, 4b, and 4c are a series of waveforms produced in the demodulator of FIG. 3.

In the circuit of FIG. 3, a sinusoidal FM input signal (usually an IF) signal is applied at terminal 10 to a limiter 40 which produces at its output a non-symmetrical square wave. This square wave is applied to a divide-by-two counter 42 which produces a symmetrical square wave at node 44 through resistor 43 as illustrated in FIG. 4(a). The square wave at node 44 is applied to a series of inverters 46, 48 and 50, the first of which 46 is operated as a voltage comparator as will be described in detail hereinafter. From inverter 50 the signal is applied to shift register delay circuit comprising a multiplicity of DC flip-flops configured as described in connection with FIG. 1. The flip-flops are operated by a clock 52 whose pulses are delivered to the respective flip-flops through a clock tree 54. As previously discussed the undelayed portion of the square wave created from the RF input at terminal 10 is applied via line 12 to exclusive-OR gate 14, and the portion of the square wave delayed by shift register delay circuit 18 is applied to exclusive-OR gate 14 via line 13. It should be noted that the "undelayed" signal is actually slightly delayed by picking the signal off after the first stage 20 of delay shift register 18. It has been found that this immediately reduces beat note amplitude by one-half compared to the circuit of FIG. 1. The output from exclusive-OR gate 14 is applied to one input of another exclusive-OR gate 56 which acts as an inverter depending upon the presence or absence of a voltage applied to the second input of gate 56 at terminal 58. The output of gate 56 is applied to LPF 28 which produces a voltage on line 30 which is representative of the original modulating signal.

As previously described, beat notes are present in the output on line 30 since the rate at which data is shifted through shift register delay circuit 54 is not usually an exact multiple of the frequency of the square wave which is being shifted through it. The beat note could be removed from the audio range if the duration of each square wave input pulse could be slightly varied from pulse to pulse such that the regularity of the non-integral division by delay circuit 18 is eliminated. This is accomplished by the addition of a capacitor 60 at node 44 and the previously described comparator 46.

Figure 4B:
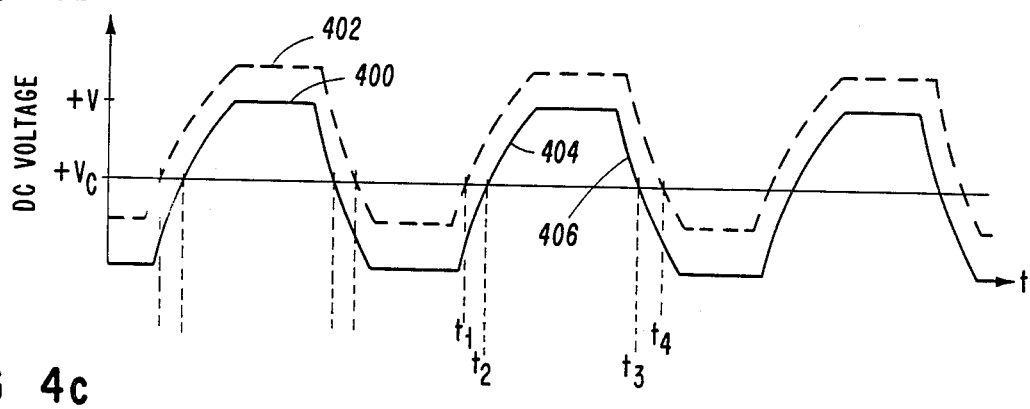
Figure 4C:
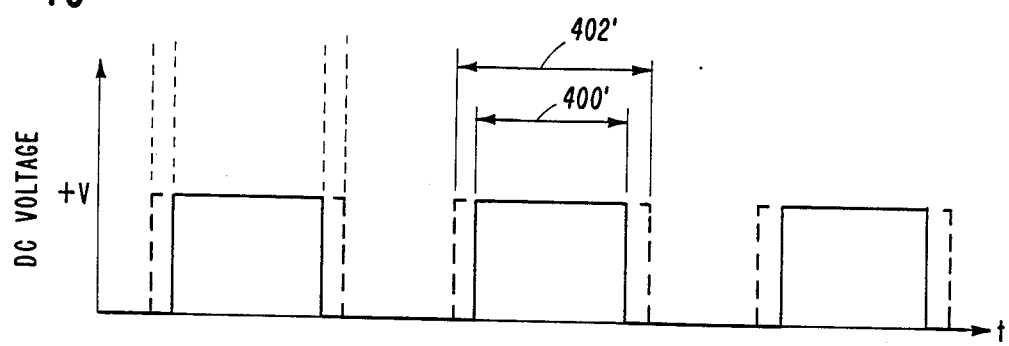

Capacitor 46 is successively charged and discharged by the square wave appearing at node 44. As shown in FIG. 4(b) the charging of capacitor 44 causes the front edge 404 of a typical square wave pulse in a waveform 400 to be rounded in its transition from zero to +V volts. Similarly, the trailing edge 406 is rounded as the voltage transitions from +V to zero volts. Comparator 46 is used as a level detector which switches from zero to +V volts, and vice versa, when the input level attains some threshold voltage Vc. If a positive DC voltage level is added to waveform 400, it is shifted upwardly to the position shown by waveform 402. When the position of the waveform is thus shifted, the time at which the waveform attains the voltage Vc required to cause comparator 46 to switch changes due to the rounded leading edge 404. Waveform 400 attains voltage Vc at time $t_2$, while shifted waveform 402 attains Vc slightly earlier at time $t_1$. Similarly, on trailing edge 406, waveform 400 decreases to Vc at time $t_3$ while waveform 402 reaches the same voltage at time $t_4$. As shown in FIG. 4(c) the results in waveforms at the output of comparator 46 which are different for waveform 400 as compared to waveform 402. Specifically, waveform 400', which corresponds to waveform 400 in FIG. 4(b), has a pulse width which is slightly shorter than that of waveform 402', which corresponds to waveform 402 in FIG. 4(b). Clearly, waveform 402' requires more samples in shift register delay circuit 18 than waveform 400', and they will thus produce different bit patterns in shift register 18. If the voltage added to waveform 402 were random as in the present invention, the pulse width as shown in FIG. 4(c) would vary from pulse to pulse, and thus produce a slightly different bit pattern in shift register 18 from pulse to pulse. This varying bit pattern destroys the repetitive bit patterns normally appearing in shift register 18 and thus eliminates the beat notes from the output by shifting them out of the audible range. The previously described comparators 48 and 50 act to square the waveform produced by comparator/level detector 46.

The random voltage, or "dither" which shifts waveform 400 to the position of waveform 402, or other random positions, may be provided by pseudorandom noise generator 62. The clock signal for noise generator 62 is derived from clock 52 and is reduced to a suitable rate by a divider 64 comprising a series of flip-flops 66, 68 and 70, each of which divides the clock signal by 2. It should be understood that any number of flip-flops could be used as indicated by the dotted connection between flip-flops 66 and 68, and flip-flops 68 and 70. Multiple taps 72 and 74 may be taken off divider 64 and passed through a switch 76 to provide a selectable division rate. The clock frequency applied to noise generator 62 is chosen to provide pseudorandom noise above the audio band, but below the radio IF.

Pseudorandom noise generator 62 operates by shifting data through a long shift register. The clock signal selected by switch 76 is applied via line 78 through an inverter 79 to a multiplicity of flip-flops 80, 82, 84, 86, 88, 90, 92, 94 and 96. Not all flip-flop stages are shown in FIG. 3 as indicated by the dotted connection between flip-flops 94 and 96. A DC signal applied at terminal 98 to the reset terminal of flip-flop 80 through an inverter 100 acts to turn generator 62 on and off. As the clock signal is applied to the 37 C" inputs of flip flops 80-96 by line 101, the contents thereof are shifted from flip-flop to flip-flop via their respective 37 D" inputs and 37 Q" outputs. A new bit to be shifted through flip-flops 80-96 is provided to the 37 D" input of flip-flop 80 by exclusive-OR gate 102 as hereinafter described.

In order to eliminate the possibility that the flip-flops will not lock into a state in which all flip-flops contain a binary 37 1" as often occurs when power is first applied to the circuit, a binary divider comprising interconnected flip-flops 110, 112, 114, 116 and 118 provides a reset signal on line 120 every 32 clock pulses when five divide-by-two stages are used as illustrated. The reset signal on line 120 and the Q output of flip-flop 96 are applied to an exclusive-OR gate 122 whose function is to invert the shift register output when a reset signal is present on line 120. The output from exclusive-OR gate 122 is applied to exclusive-OR gate 102 whose second input is derived from taps from the various stages of the shift register along line 124.

When the circuit for pseudorandom generator 62 is properly implemented, a maximally long random sequence of binary 0's and 1's is produced and applied from line 124 to capacitor 60. Resistors 130, 132, 134, 136, 138, 140 and 141 provide a D/A converter such that an 8 level pseudorandom voltage is applied to capacitor 60. It should be understood that any other design for random noise generator 62 would be equally suitable. The application of the random noise voltage to capacitor 60 has the effect of shifting the level of the square wave appearing at node 44 as previously described in connection with FIG. 4(b).

It should be noted that flip-flop divider 42 is not necessary to operation of the invention. The primary advantage of flip-flop 42 is that it assures a 50% duty cycle waveform at node 44. Otherwise, the IF signal feeds through and a better LPF 28 would be required. Further, dither can be optionally applied prior to divider 42 without departing from the invention.

Figure 5:
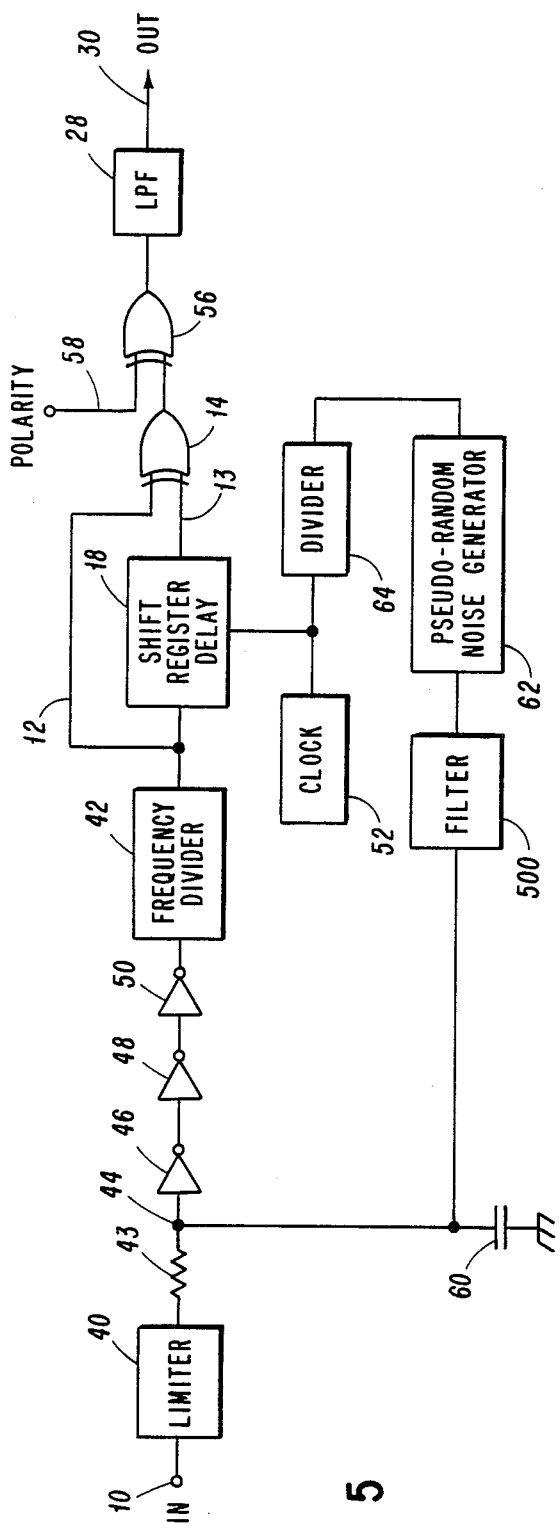
FIG. 5 is a schematic diagram of the circuit of FIG. 3 employing filtered dither.

Referring to FIG. 5, a more generalized version of the circuit of FIG. 3 is shown with like numbered elements being the same in both figures. The only differences in FIG. 5 are the addition of a filter 500 between pseudorandom noise generator 62 and capacitor 60 to shape the noise spectrum which is added to the IF signal at node 44, and placement of divider 42 after inverter 50. By properly choosing the characteristics of filter 500, feedthrough of noise which would degrade the output signal on line 30 is reduced, thus obtaining an improved signal to noise ratio. The filter characteristics are chosen such that noise of frequencies at the IF and its odd harmonics is eliminated, if no IF division is applied. In the case where the IF is divided, the filter nulls are chosen in the audio band and even harmonics of the divided-down IF.

Figure 6:
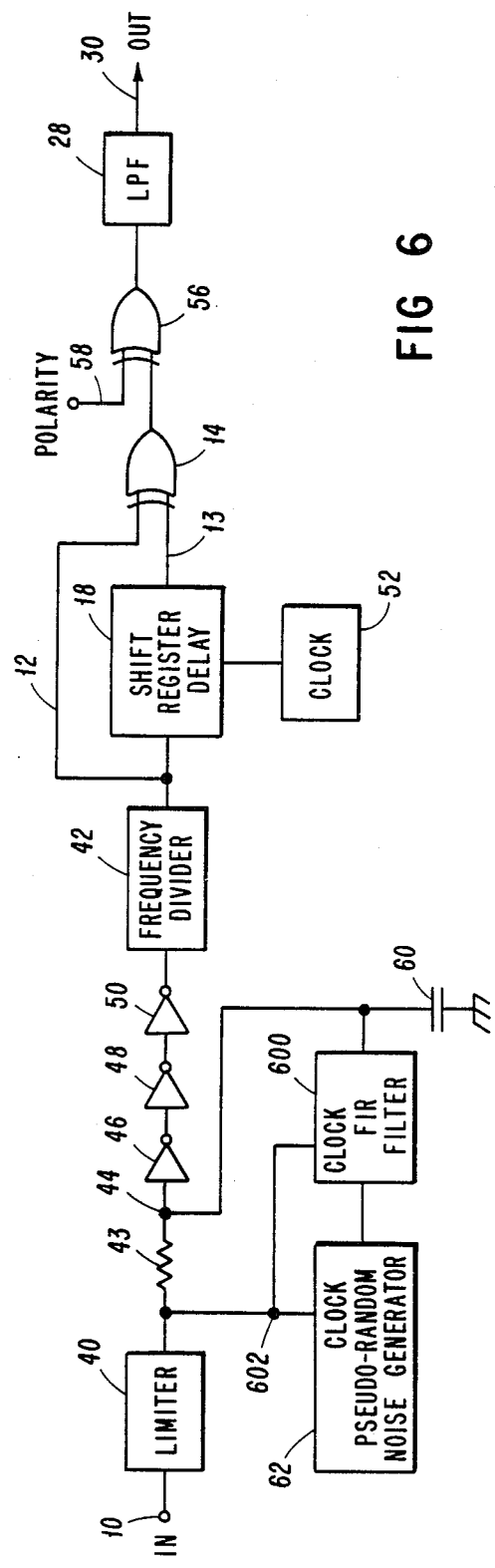
FIG. 6 is a schematic diagram of the circuit of FIG. 3 employing filtered dither in an alternative manner.

Referring next to FIG. 6, a second alternative embodiment based upon the circuit of FIG. 3 is shown, again with like numbered elements being the same in both figures. In FIG. 5, a finite impulse response (FIR) filter 600 of the type well known in the art is interposed between pseudorandom noise generator 62 and capacitor 60. As is well known, FIR filters are digital filters based upon a shift register construct and thus require a clock signal. Rather than using clock 52 to provide this signal, the signal being demodulated is used as a clock signal. This signal may be picked off after limiter 40 and applied to the clock input of FIR filter 600 on line 602. The same signal may be used to clock pseudorandom noise generator 62.

The nulls of FIR filter 600 are chosen in the same manner as described for filter 500 in FIG. 5. The use of the signal being demodulated as the clock signal, which may be an IF signal, permits dynamic filtering of the pseudorandom noise generator spectrum. When the IF (input signal) changes frequency, the nulls of FIR filter 600 move with the IF, which prevents feedthrough of noise at the unwanted frequencies regardless of changes in the frequency of the IF.

FIGS. 7a and 7b show examples of possible filtered noise spectra for FIR filter 600 in FIG. 6. FIG. 7a shows a filter design for audio bandpass noise where no IF division is performed. FIG. 7b shows a suitable response for filter 600 in FIG. 6 for the case where the IF is divided by 4 after dither is applied. This filter response may be obtained by using FIR filter taps −1, 1, 1, and −1 in that order in the usual FIR structure. Other response shapes may be obtained by using the Parks-McClellan FIR filter design algorithm. References for this algorithm and other suitable FIR design methods include: McClellan, James, H., Parks, T. W., and Rabiner, L. R., "A Computer Program for Designing Optimum FIR Linear Phase Digital Filters," IEEE Trans. Audio and Electroacoustics, AU-21, pp 506–526, Dec. 1973; Rabiner, L. R., and Gold, B., *Theory and Application of Digital Signal Processing*, Prentice-Hall, 1975 (Chapter 3); and Oppenheim, A. V. and Schafer, A. W., *Digital Signal Processing*, Prentice-Hall, 1975 (Chapters 3 and 5).

While particular embodiments of the present invention have been shown and described, it is obvious that changes and modifications may be made therein without departing from the true scope and spirit of the invention. It is the intent in the appended claims to cover all such changes and modifications.

I claim:

1. A digital FM demodulator, comprising:

means for producing a square wave signal having a frequency related to the FM signal;
means for generating a random signal;
means for filtering said random signal;
means for modulating the duration of a portion of the square wave;
means for applying said filtered random signal to the modulating means;
means for delaying said modulated square wave;
means for combining said modulated square wave with said delayed modulated square wave; and
means for extracting a DC component from said combined signal;

2. A digital FM demodulator as described in claim 1 wherein said filtering means has nulls at the frequency of said square wave and at odd harmonics thereof.

3. A digital FM demodulator as described in claim 1 further including means for dividing the frequency of said square wave and wherein said filtering means has nulls in the audio band and at the even harmonics of the divided frequency.

4. A digital FM demodulator as described in claim 1 wherein said modulating means comprises:
means for increasing the transition times of said square wave signal to produce a first modified square wave signal;
means for adding said filtered random signal to the first modified square wave signal to produce a second modified square wave signal; and
means for detecting passage of said second modified square wave signal through a predetermined signal level to produce a third modified square wave signal;

5. A digital FM demodulator, comprising:
means for producing a square wave signal having a frequency relationship to the FM signal;
means for modulating the duration of a portion of the square wave;
means for generating a random signal;
a FIR filter receptive of said random signal to produce a filtered random signal;
means for applying said filtered random signal to the modulating means;
means for delaying said modulated square wave;
means for combining said modulated square wave with said delayed modulated square wave; and
means for extracting a DC component from said combined signal.

6. A digital FM demodulator as described in claim 5 wherein said FIR filter is clocked by said square wave signal.

7. A digital FM demodulator as described in claim 6 wherein said FIR filter provides nulls at the frequency of said square wave and at odd harmonics thereof.

8. A digital FM demodulator as described in claim 6 further including means for dividing the frequency of said square wave and wherein said FIR filter provides nulls in the audio band and at the even harmonics of the divided frequency.

9. A digital demodulator for an FM signal, comprising:
a limiter for producing a square wave signal from said FM signal;
means for increasing the transition times of the square wave signal to produce a first modified square wave signal;
means for generating a random signal;
means for filtering said random signal;
means for adding said filtered random signal to the first modified square wave signal to produce a second modified square wave signal;
means for detecting passage of said second modified square wave signal through a predetermined signal level to produce a third modified square wave
means for delaying said third modified square wave signal;
means for combining said third modified square wave signal with said delayed third modified square wave signal; and
a low pass filter for extracting a DC component from said combined signal, said DC component representing a demodulated signal.

* * * * *

UNITED STATES PATENT AND TRADEMARK OFFICE
CERTIFICATE OF CORRECTION

PATENT NO. : 4,772,853

DATED : September 20, 1988

INVENTOR(S) : Billy D. Hart

It is certified that error appears in the above-identified patent and that said Letters Patent is hereby corrected as shown below:

On the title page, Item [22], "Filed: Aug. 12, 1987"

should read       -- Filed: Aug. 11, 1987 --.

Signed and Sealed this

Fourteenth Day of February, 1989

*Attest:*

DONALD J. QUIGG

*Attesting Officer*    *Commissioner of Patents and Trademarks*